United States Patent [19]
Takahashi et al.

[11] Patent Number: 5,666,062
[45] Date of Patent: Sep. 9, 1997

[54] VOLTAGE MEASURING USING ELECTRO-OPTIC MATERIAL'S CHANGE IN REFRACTIVE INDEX

[75] Inventors: Hironori Takahashi; Kazuhiko Wakamori; Musubu Koishi; Akira Takeshima, all of Hamamatsu, Japan

[73] Assignee: Hamamatsu Photonics K.K., Hamamatsu, Japan

[21] Appl. No.: 531,542

[22] Filed: Sep. 19, 1995

[30] Foreign Application Priority Data

Sep. 19, 1994 [JP] Japan .................................. 6-223618
Sep. 29, 1994 [JP] Japan .................................. 6-235162

[51] Int. Cl.$^6$ .......................... G01R 23/00; G01R 23/16
[52] U.S. Cl. ............................................ 324/753; 324/96
[58] Field of Search .......................... 324/73.1, 158.1, 324/751, 753, 765, 76.77, 96, 244.1; 250/231.1, 227.1

[56] References Cited

U.S. PATENT DOCUMENTS

| | | | |
|---|---|---|---|
| 3,886,370 | 5/1975 | Schubet et al. | 324/765 |
| 4,618,819 | 10/1986 | Mourou et al. | 324/77 |
| 4,891,580 | 1/1990 | Valdmanis | 324/96 |
| 4,906,922 | 3/1990 | Takahashi et al. | 324/96 |
| 4,996,475 | 2/1991 | Takahashi et al. | 324/96 |
| 5,126,661 | 6/1992 | Harvey et al. | 324/96 |
| 5,153,667 | 10/1992 | Aoshima et al. | 356/218 |
| 5,256,968 | 10/1993 | Loualiche et al. | 324/96 |
| 5,260,648 | 11/1993 | Brust | 324/158.1 |

FOREIGN PATENT DOCUMENTS

| | | |
|---|---|---|
| 0 430 661 | 6/1991 | European Pat. Off. |
| 0 493 906 | 7/1992 | European Pat. Off. |
| 2 680 248 | 2/1993 | France . |
| 3-170874 | 7/1991 | Japan . |
| 4-307379 | 10/1992 | Japan . |

OTHER PUBLICATIONS

Frankel et al, "Optoelectronic Transient Characterization of Ultrafast Devices", IEEE Journal of Quantum Electronics, vol. 28, No. 10, Oct. 1992, pp. 2313–2324.

Kolner et al, "Electrooptic Sampline in GaAs Integrated Circuits", IEEE Journal of Quantum Electronics, vol. OE–22, No. 1, Jan., 1986, pp. 79–93.

Valdmanis et al, "Subpicosecond Electrooptic Sampling: Principles and Applications", IEEE Journal of Quantum Electronics, vol. OE–22, No. 1, Jan. 1986, pp. 69–78.

Primary Examiner—Vinh P. Nguyen
Attorney, Agent, or Firm—Cushman, Darby & Cushman, IP Group of Pillsbury Madison & Sutro LLP

[57] ABSTRACT

In this system, reflected light from an electro-optic probe is detected by a photodetector, and only a voltage signal of a frequency which is an integral multiple of the fundamental frequency of the output voltage from the photodetector is detected. The frequency characteristics of the output voltage from the photodetector can be measured at a high speed and a high accuracy.

5 Claims, 8 Drawing Sheets

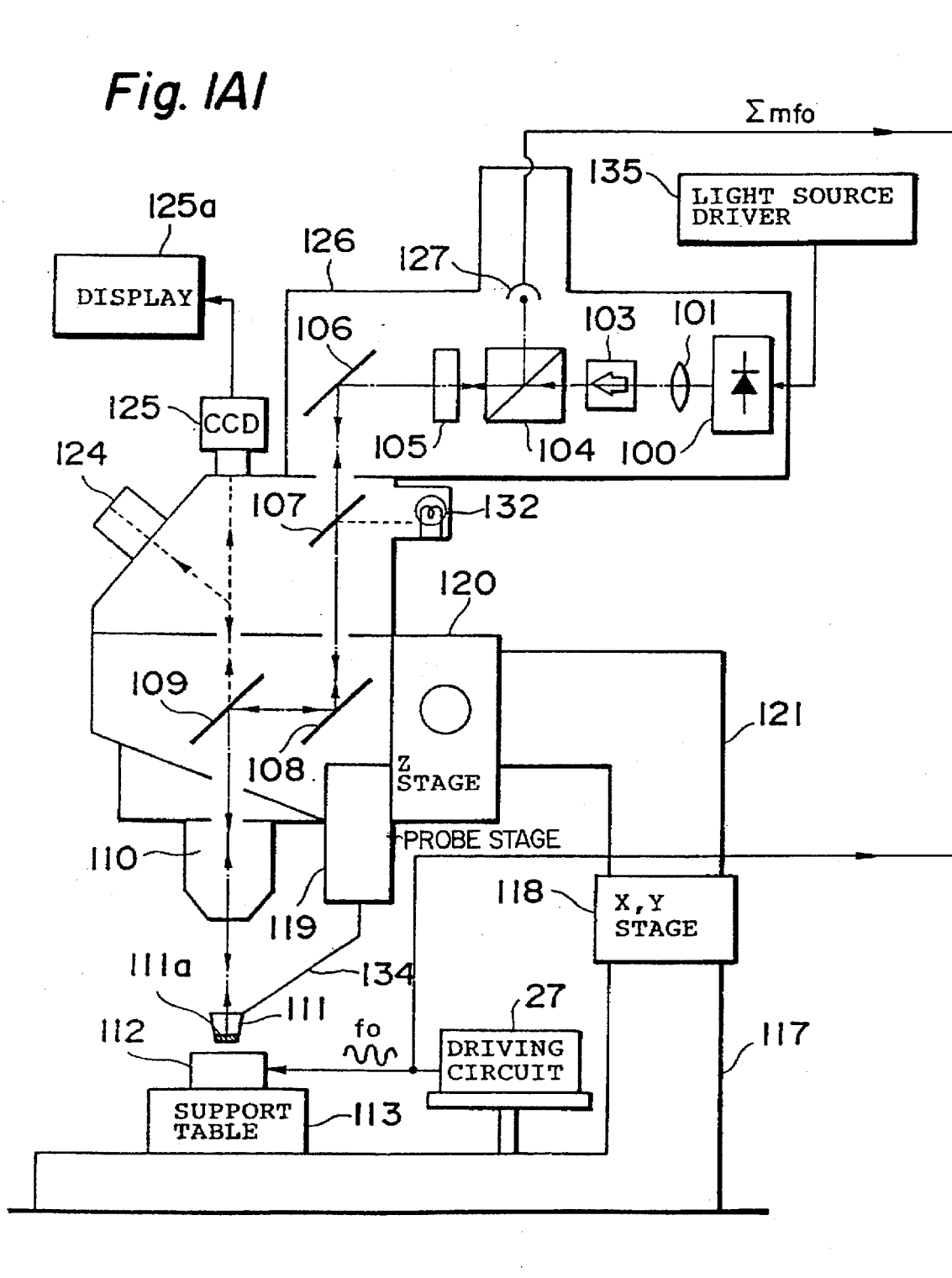
Fig. IAI

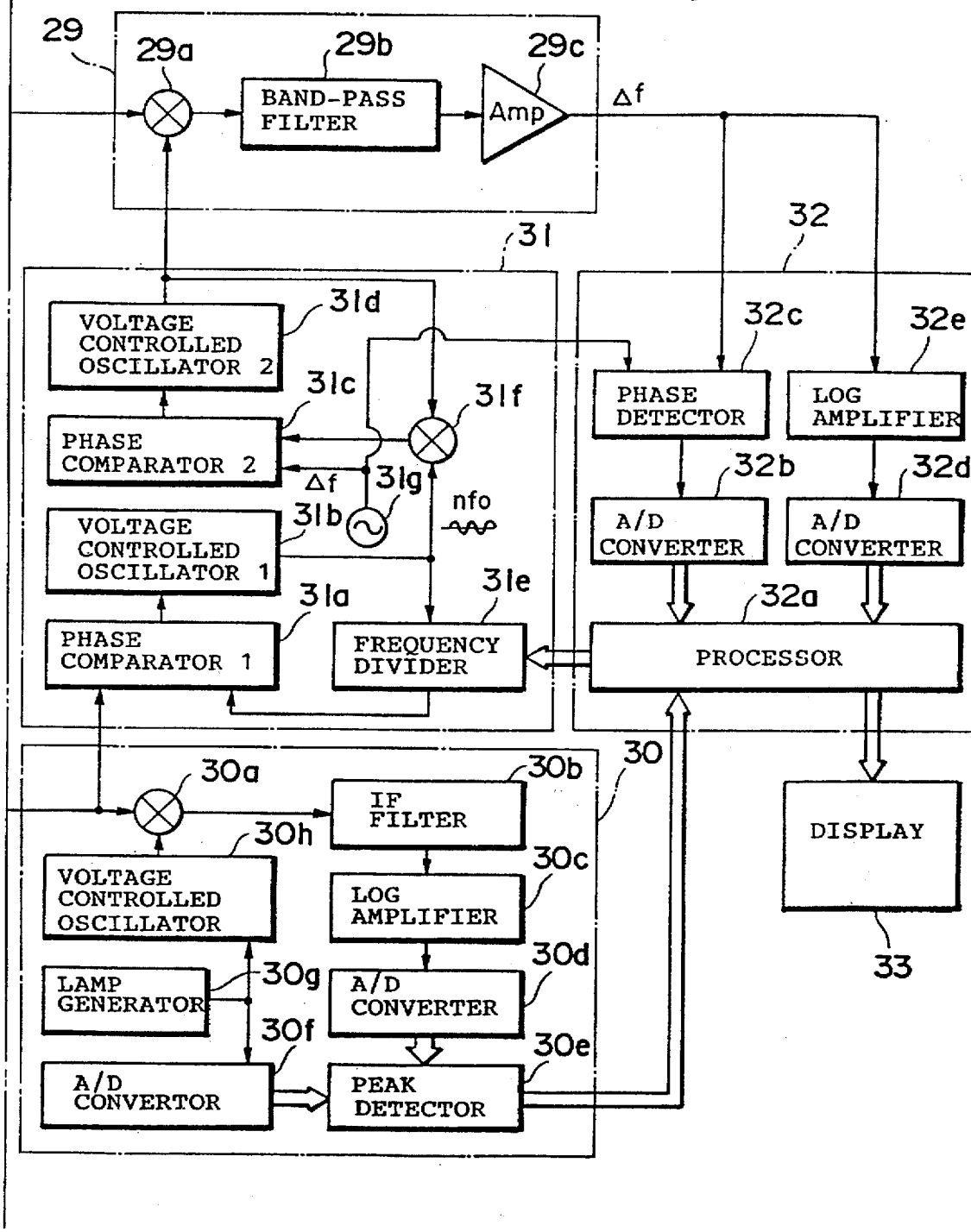
Fig. 1A2

VOLTAGE MEASURING USING ELECTRO-OPTIC MATERIAL'S CHANGE IN REFRACTIVE INDEX

BACKGROUND OF THE INVENTION

1. Field of the Invention

The present invention relates to a voltage measurement system for measuring the voltage of an object to be measured by using an electro-optic material which changes its refractive index in accordance with a change in the applied electric field.

2. Related Background Art

One conventional electro-optic probing system is disclosed in Japanese Patent Laid-Open No. 4-307379. This voltage measurement apparatus can measure voltage waveforms in a non-contact state with a high time resolution. Therefore, the apparatus is suitable for evaluation of microwave devices which operate at a high frequency.

SUMMARY OF THE INVENTION

A voltage measurement apparatus of the present invention measures the potential on a sample to be measured by using a probe made from an electro-optic material. This probe changes its refractive index in accordance with the nearby potential. Consequently, light reflected by the probe is modulated according to this potential, so it is possible to measure the potential of the sample by detecting this reflected light with a photodetector.

This apparatus includes a spectrum analyzer or the like component. A sample to be measured is applied with a voltage of a frequency $f_0$ by a driving circuit. The voltage waveform of the sample contains this fundamental frequency $f_0$ and its harmonic components $nf_0$ ($n=2, 3, 4, \ldots$).

This apparatus measures the amplitudes or the phase of these frequency components and displays a frequency spectrum on a display. The spectrum analyzer includes (a) a fundamental frequency extractor (extracting means) for detecting only the fundamental frequency $f_0$ of the frequency components of the output voltage from the driving circuit, (b) a frequency multiplier (multiplying means), and a narrow-band amplifier (amplifying means).

Also, this spectrum analyzer is controlled by an analyzer, e.g., a computer which includes a processor. The processor of the analyzer receives data of the fundamental frequency $f_0$ detected by the fundamental frequency extractor. The processor outputs integers $n=1, 2, 3, \ldots$ to the frequency multiplier by using an internal programmable counter or the like unit. The frequency multiplier is applied with a voltage signal of the frequency $f_0$ and generates a frequency $nf_0$ which is an integral multiple of the input frequency $f_0$. The frequency multiplier outputs a voltage signal of a frequency $\Delta f + nf_0$.

The narrow-band amplifier synthesizes an output $\Sigma nf_0$ from the photodetector and the output $\Delta f_0 + nf_0$ from the frequency multiplier and performs narrow-band amplification for the resulting beat signal, $\Delta f$. The processor causes the display to display the amplitude of the beat signal $\Delta f$ when $n$ is a predetermined value. Also, the processor calculates the frequency $nf_0$ corresponding to this n and displays the calculation result, in conjunction with the amplitude of the beat signal $\Delta f$, on the display.

In this voltage measurement apparatus, narrow-band amplification is performed for the output of the photodetector for each measurement frequency which is an integral multiple of the fundamental frequency, and the characteristics on the frequency axis of the photodetector output are directly measured. This eliminates the need for temporarily Fourier-transforming the obtained time waveform in order to obtain the voltage information of an object to be measured on the frequency axis. Consequently, it is possible to measure the voltage of the object on the frequency axis within short time periods without producing any calculation error.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
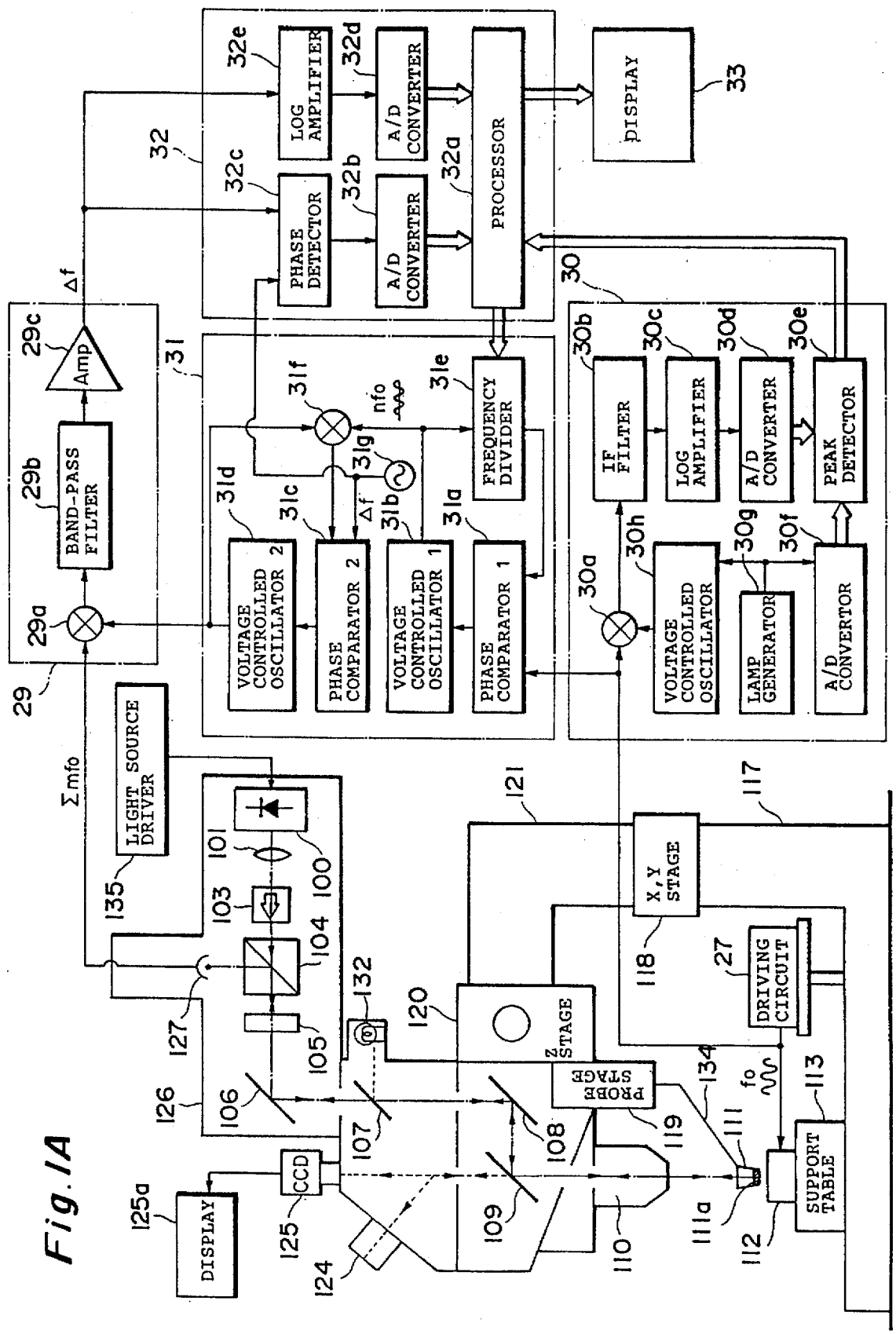
FIG. 1A (1A1 and 1A2) is a block diagram showing an E-O probing system according to the first embodiment.

FIG. 1A (1A1 and 1A2) is a block diagram showing the arrangement of a voltage measurement apparatus according to the first embodiment of the present invention.

This voltage measurement apparatus is an E-O probing system which uses an electro-optic effect.

The apparatus includes a semiconductor laser diode (light source) 100, a lens 101, an isolator 103, a polarizing beam splitter (PBS) 104, a ⅛ wave plate 105, mirrors 106 and 108, half mirrors 107 and 109, an objective lens 110, a probe 111, a support table 113, an eyepiece 124, a CCD camera 125, a housing 126, a photodiode (photodetector) 127, a base 117, an XY stage 118, a probe stage 119, a Z stage 120, a stage support member 121, an illuminating light source 132, and an arm 134.

A sample 112 to be measured is placed on the support table 113.

The light source 100 is a continuous-wave (CW) laser which is driven by a light source driver 135. The measurement light emitted from the CW laser 100 passes through the lens 101, the isolator 103, the PBS 104, the ⅛ wave plate 105, the mirror 106, the half mirror 107, the mirror 108, and the half mirror 109 in this order and is condensed on a reflecting film 111a on the bottom surface of the E-O probe 111 by the objective lens 110.

The E-O probe 111 is made from an electro-optic material which changes its refractive index when applied with an electric field. Also, the E-O probe 111 is arranged near the device 112 to be measured, and this device 112 is operated by an output driving electrical signal from a driving circuit 27. The driving circuit 27 applies a voltage signal of a frequency $f_0$ to the device 112.

The refractive index of the E-O probe 111 changes in accordance with the applied electric field to the device 112, i.e., the voltage to be measured of the device 112. Accordingly, the polarized state of the measurement light changes when the measurement light passes the E-O probe 111.

The measurement light whose polarized state has thus changed is reflected by the reflecting film 111a on the bottom surface of the E-O probe 111, and returns to the PBS 104 along the incident path. Of the measurement light returning to the PBS 104, only components perpendicular to those upon incidence are reflected, and the remaining components are transmitted.

The change in the polarized state of the light reflected by the reflecting film 111a is converted into a change in the intensity when the light is reflected by the PBS 104. Therefore, the voltage of the device 112 is detected by measuring the light intensity detected by the high-speed photodetector 127.

The output voltage signal from the photodetector 127 contains a fundamental frequency $nf_0$ (n=1) and frequency components (harmonic components) $nf_0$ (n=2, 3, 4, . . . ) which are integral multiples of the fundamental frequency $f_0$.

The photodetector 127 is electrically connected to a narrow-band amplifier 29. This narrow-band amplifier 29 includes a mixer 29a for mixing two input signals and outputting the beat signals, a band-pass filter 29b, and an amplifier 29c. The voltage signal from the photodetector 127 is applied to the mixer 29a of the narrow-band amplifier 29.

The narrow-band amplifier 29 amplifies only a predetermined frequency component of the input signal. This frequency component of the voltage to be amplified by the amplifier 29 is determined by an output from a frequency multiplier 31.

The driving circuit 27 applies a voltage signal (for example sinusoidal wave) of the fundamental frequency $f_0$ to the device 112. This frequency $f_0$ is, e.g., 100 MHz. The frequency multiplier 31 is connected to the driving circuit 27. The frequency multiplier 31 consists of a first phase comparator (PC) 31a, a first voltage controlled oscillator (VCO) 31b, a second phase comparator (PC) 31c, a second voltage controlled oscillator (VCO) 31d, a frequency divider 31e, a mixer 31f, and a local oscillator 31g.

The output voltage signal of the frequency $f_0$ from the driving circuit 27 is applied to the first phase comparator 31a of the frequency multiplier 31. An output from the frequency divider 31e is also applied to the first phase comparator 31a. The phase comparator outputs a voltage signal in accordance with the phase difference between the two input signals.

The output voltage signal from the phase comparator 31a is applied to the first voltage controlled oscillator 31b. The voltage controlled oscillator is an oscillator whose oscillation frequency linearly changes with an input voltage (control voltage). Accordingly, the higher the output voltage from the first phase comparator 31a, the higher the output oscillation frequency from the first voltage controlled oscillator 31b; the lower the output voltage from the first phase comparator 31a, the lower the output oscillation frequency from the first voltage controlled oscillator 31b.

The frequency divider 31e is a 1/N programmable divider which multiplies the output frequency from the first voltage controlled oscillator 31b by 1/N and outputs the resulting frequency. The frequency divider 31e is controlled by a processor 32a. The dividing ratio, N, of the frequency divider 31e is designated by the processor 32a.

Accordingly, by the designation from the processor 32a the frequency of the output voltage signal from the first voltage controlled oscillator 31b is multiplied. For example, when the dividing ratio N of the frequency divider 31e designated by the processor 32a is 2, the first voltage controlled oscillator 31b outputs a voltage with a frequency of $2 \times f_0$; when the designated dividing ratio N is 3, the first voltage controlled oscillator 31b outputs a voltage with a frequency of $3 \times f_0$.

The output from the first voltage controlled oscillator 31b is applied to the mixer 31f. An output from the second voltage controlled oscillator 31d is also applied to the mixer 31f. The mixer 31f mixes these signals and outputs the beat signal. The second voltage controlled oscillator 31d is controlled by an output voltage signal from the second phase comparator 31c. The second phase comparator 31c receives an output voltage signal of a frequency $\Delta f$ from the local oscillator 31g and the voltage signal from the mixer 31f. The second phase comparator 31c eliminates the difference between the phase of the output voltage signal from the mixer 31f and the phase of the output voltage signal of the frequency $\Delta f$ from the local oscillator 31g. As a result, the second voltage controlled oscillator 31d outputs a voltage signal of a frequency $nf_0 + \Delta f$.

The output voltage signal of the frequency $nf_0 + \Delta f$ from the frequency multiplier 31 is applied to the mixer 29a of the narrow-band amplifier 29. The mixer 29a is also applied with an output voltage signal of a frequency $\Sigma mf_0$ (m is an integer) from the photodetector 127. Accordingly, the frequency component $nf_0$ to be amplified by the narrow-band amplifier 29 is determined by the dividing ratio N designated by the processor 32a. The beat signal $\Delta f$ corresponding to the amplitude intensity of the voltage with the frequency component $nf_0$ passes through the band-pass filter 29b, is amplified by the amplifier 29c, and is applied to an analyzer 32.

The output voltage signal of the frequency $\Delta f$ from the narrow-band amplifier 29 is input to a LOG amplifier 32e. The LOG amplifier 32e amplifies the voltage signal of the frequency $\Delta f$ by logarithmic conversion and applies the amplified signal to an A/D converter 32d. The A/D converter 32d converts the input analog signal into a digital signal and outputs the digital signal.

The output voltage signal of the frequency $\Delta f$ from the narrow-band amplifier 29 is input to a phase detector 32c. The phase detector 32c is also applied with the voltage signal of the frequency $\Delta f$ from the local oscillator 31g. Accordingly, the phase difference between these signals is detected by the phase detector 32c, and the output signal from the phase detector 32c is applied to an A/D converter 32b. The A/D converter 32b converts the input analog signal into a digital signal and outputs the digital signal. The output digital data from these A/D converters 32b and 32d are applied to the processor 32a. Therefore, when the processor 32a sequentially designates the dividing ratios N (1, 2, 3, . . . , n) of the frequency divider 31e, it is possible to measure the fundamental frequency $f_0$ and its harmonic components $n \times f_0$ of the voltage of the device 112. The measured frequency components are displayed on a display 33. Also, during the measurements an image of the device 112 is photographed by the CCD camera 125 and displayed on a display 125a such as a cathode-ray tube (TV monitor).

The fundamental frequency $f_0$ of the output voltage signal from the driving circuit 27 is detected by a fundamental frequency extractor 30.

This fundamental frequency extractor 30 includes a ramp generator 30g. The ram generator 30g generates a voltage which periodically increases with respect to the time axis. The ramp generator 30g is connected to a voltage controlled oscillator 30h. Consequently, the voltage controlled oscillator 30h outputs a voltage signal whose frequency periodically changes (e.g., from 10 MHz to 300 MHz).

Both the output voltage signal from the driving circuit 27 and the output voltage signal from the voltage controlled oscillator 30h are applied to a mixer 30a. The mixer 30a mixes these signals and outputs the mixed signal. An intermediate frequency (IF) filter 30b separates an intermediate-frequency component (e.g., 5 MHz) from the mixed signal. The output from the IF filter 30b is amplified by a LOG amplifier 30c and converted into digital data by an A/D converter 30d.

The ramp generator 30g is also connected to an A/D converter 30f, so the output voltage signal from the ramp generator 30g is converted into digital data by the A/D converter 30f.

The outputs from the A/D converters 30d and 30f are together input to a peak detector (processor) 30e. The peak detector 30e detects the output from the A/D converter 30f when the output from the A/D converter 30d peaks. The relationship between the output voltage from the ramp generator 30g and the frequency of the voltage signal generated by the voltage controlled oscillator 30h is a predetermined one-to-one correspondence. Therefore, the peak detector 30e can detect the fundamental frequency $f_0$ of the output voltage signal from the driving circuit 27 by detecting the output from the A/D converter 30f.

Assume, for example, that the frequency of the output voltage signal from the voltage controlled oscillator 30h is swept from 10 to 300 MHz when the fundamental frequency $f_0$ is 100 MHz and the frequency which is passed by the IF filter 30c is 5 MHz. The beat signal is 5 MHz when the frequency of the output voltage from the voltage controlled oscillator 30h is 105 MHz, and this beat signal passes through the IF filter 30b. Consequently, the value of the output voltage from the LOG amplifier 30c is a maximum. The peak detector 30e, therefore, detects that the frequency of the output voltage signal from the voltage controlled oscillator 30h is 105 MHz and the fundamental frequency $f_0$ is 100 MHz. This data is input to the processor 32a of the analyzer 32.

The processor 32a is capable of detecting the fundamental frequency $f_0$ from the output of the fundamental frequency extractor 30. The phases and the amplitudes of harmonics nf of this fundamental frequency can be detected by designating the dividing ratio N from the processor 32a. These detected amplitudes and phases of the fundamental frequency and the harmonics are displayed on the display 33.

In measuring the voltage of the device 112 by using this system, the frequency is first swept from 10 MHz, with a wide frequency band width of 100 MHz, by using the fundamental frequency extractor 30. The peak detector 30e detects the fundamental frequency $f_0$. By changing the narrow frequency band width to 1 MHz, frequencies near the measured fundamental frequency $f_0$ are swept, thereby detecting the fundamental frequency $f_0$ with a higher accuracy.

The processor 32a calculates harmonic frequencies 200, 300, 400, . . . MHz which are integral multiples of fundamental frequency $f_0$=100 MHz. The harmonic frequencies are measured by zero sweep. That is, the processor 32a designates the dividing ratio N to the frequency multiplier 31. When N=2, the phase and amplitude data of a second harmonic are input to the processor. The processor 32a accumulates these data and displays them on the display 33.

Figure 1B:
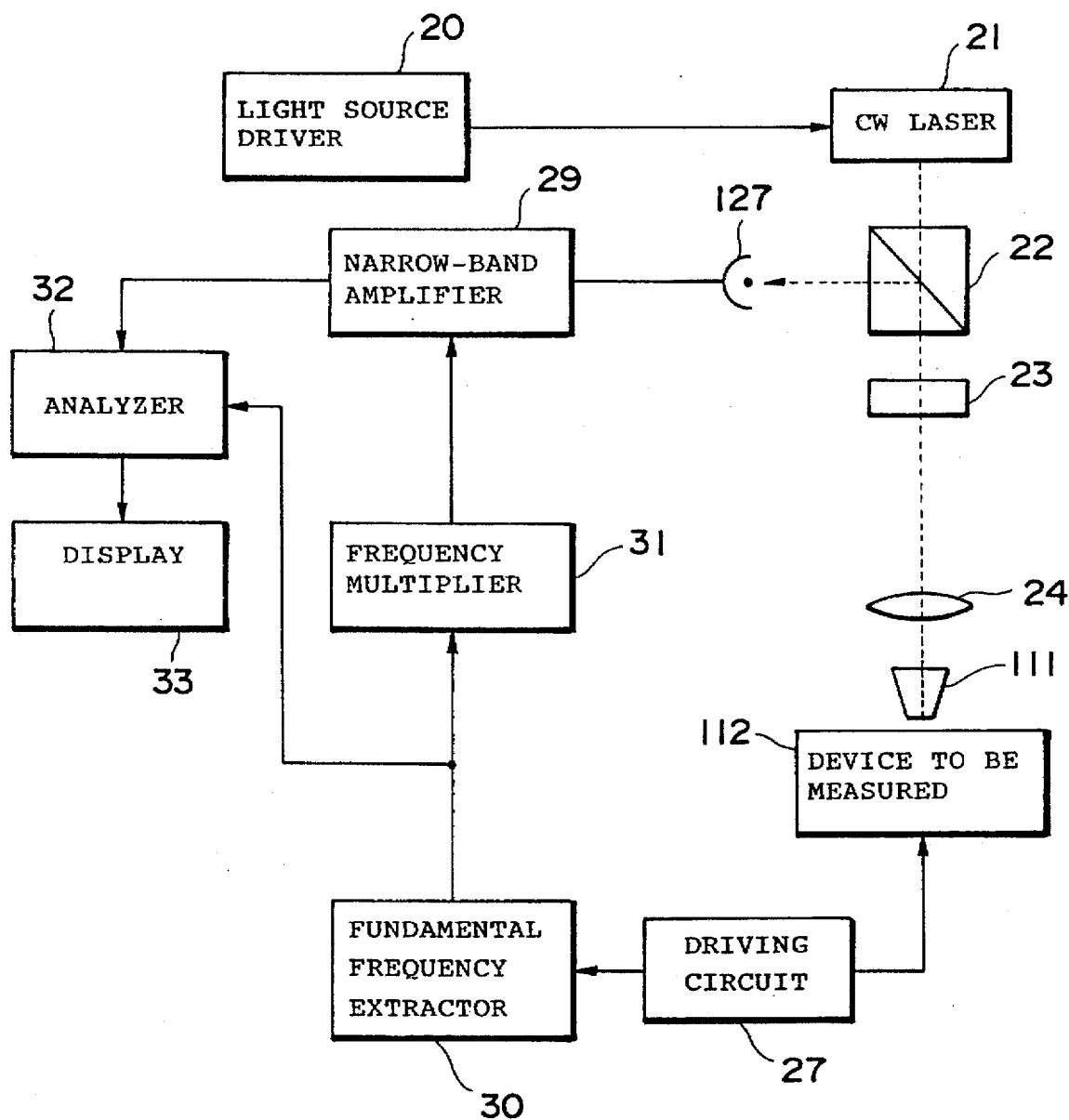
FIG. 1B is a block diagram showing a modification of the system in FIG. 1A (1A1 and 1A2)

FIG. 1B shows a modification of the apparatus illustrated in FIG. 1A (1A1 and 1A2). This modification will be described below. Note that the same reference numerals as in FIG. 1A (1A1 and 1A2) denote the same parts in FIG. 1B.

A narrow-band amplifier 29 is so designed as to be able to vary its center frequency. For example, this narrow-band amplifier 29 can be composed of a unit in which a large number of narrow-band filters are arranged parallel to each other, or of a combination of a variable-frequency narrow-band filter and a wide-band amplifier.

Generally, microwave devices are exclusively used in certain limited frequency bands such as an X band (8 to 12 GHz) and a K band (18 to 26 GHz). Therefore, the configuration of the narrow-band amplifier 29 need only be optimized in accordance with the frequency band used.

If an output driving electrical signal waveform from a driving circuit 27 to a device 112 to be measured is a repetition waveform, the frequency components of the waveform of an electrical signal to be measured are limited to integral multiples of the fundamental clock frequency. Therefore, it is only necessary to measure the output from a photodetector 127 at these frequencies. For this reason, in this embodiment the output from the driving circuit 27 which drives the device 112 is applied to a fundamental frequency extractor 30 to thereby extract the fundamental clock frequency, $f_0$. This fundamental clock frequency $f_0$ is input to a frequency multiplier 31, and frequencies $f_n = nf_0$ (n=1, 2, 3, 4, . . . ), which are integral multiples of the fundamental clock frequency, are generated as measurement frequencies. The narrow-band amplifier 29 receives these measurement frequencies and operates at these frequencies. That is, the narrow-band amplifier 29 performs narrow-band amplification for output components having these measurement frequencies of the output from the high-speed photodetector 127. The output from the narrow-band amplifier 29 is applied to an analyzer 32 where the amplitude of the narrow-band-amplified signal is measured.

The analyzer 32 is also applied with the fundamental clock frequency $f_0$ from the fundamental frequency extractor 30. Therefore, the analyzer 32 measures the amplitude and the phase of the output from the narrow-band amplifier 29 on the basis of this fundamental clock $f_0$. Thus the analyzer 32 measures the amplitude and the phase of the electrical signal to be measured at each predetermined measurement frequency. The measurement results are displayed on a display 33 by a display method such as an S parameter method.

In the voltage measurement apparatus according to this embodiment, the measurement frequencies of an electrical signal to be measured are limited as described above. Accordingly, the measurements do not require a long measurement time even if the frequency band width of the narrow-band amplifier 29 is very narrowed. That is, the fundamental frequency of the electrical signal to be measured which drives the device 112 is known information. Therefore, the measurement time is shortened by performing narrow-band amplification and detection only for outputs in known frequency points.

As an example, when the fundamental clock frequency, $f_0$, is 1 GHz the number of measurement points up to 10 GHz is only ten, so the measurements can be completed within a very short time. In contrast, if measurements are done by sweeping all frequency regions by using a spectrum analyzer, it is necessary to perform the measurements at a 1000 point and the required measurement time is 100 times that of this embodiment. That is, a spectrum analyzer of a network analyzer measures the voltage amplitude and the phase of the signal at a predetermined frequency, and the measurement is performed while the frequency is swept in the region to be measured. When using a spectrum analyzer, a sweep frequency range to be measured and its band are set as follows: The measurement frequency is swept from low frequency to high frequencies. 1/f noise is great in a frequency region below 10 MHz, and the measurement is not performed using a signal below the 10 MHz, such as a DC voltage signal. The measurements are done using signals with predetermined frequencies ranging from 10 MHz to 10 GHz. During measurement, the predetermined frequency is changed in 10 MHz steps, the predetermined frequency band width is 10 MHz and is determined by using an electrical filter, thereby making it necessary to perform the measurements at a 1000 point as described above.

Also, a time required to make the measurement at each measurement point is inversely proportional of the frequency band width. Accordingly, when two measurements are made in which the measuring time is constant but the frequency band width is different, the signal measured using the narrower frequency band width has higher S/N ratio.

According to this embodiment as described above, the output from the photodetector 127 is narrow-band-amplified for each measurement frequency $nf_0$ which is an integral multiple of the fundamental frequency $f_0$. Consequently, the characteristics on the frequency axis of the output from the photodetector 127 are directly measured in the voltage measurement apparatus. Accordingly, in evaluating a microwave device in a non-contact voltage measurement apparatus using an E-O probe, it is possible to obtain the measurement results on the frequency axis within short time periods with a high S/N ratio, without performing Fourier transformation of a time waveform on the time axis.

If the frequency characteristics, the amplitudes and the phases, of the photodetector 127 and the narrow-band amplifier 29 are not flat, a device having known characteristics is previously measured to prepare correction data of the apparatus. With this correction data the analyzer 32 can correct these frequency characteristics.

Also, if it is wanted to obtain the time waveform of an electrical signal to be measured, it is only necessary to perform Fourier transformation for the measurement results on the frequency axis given by the analyzer 32.

Figure 2:
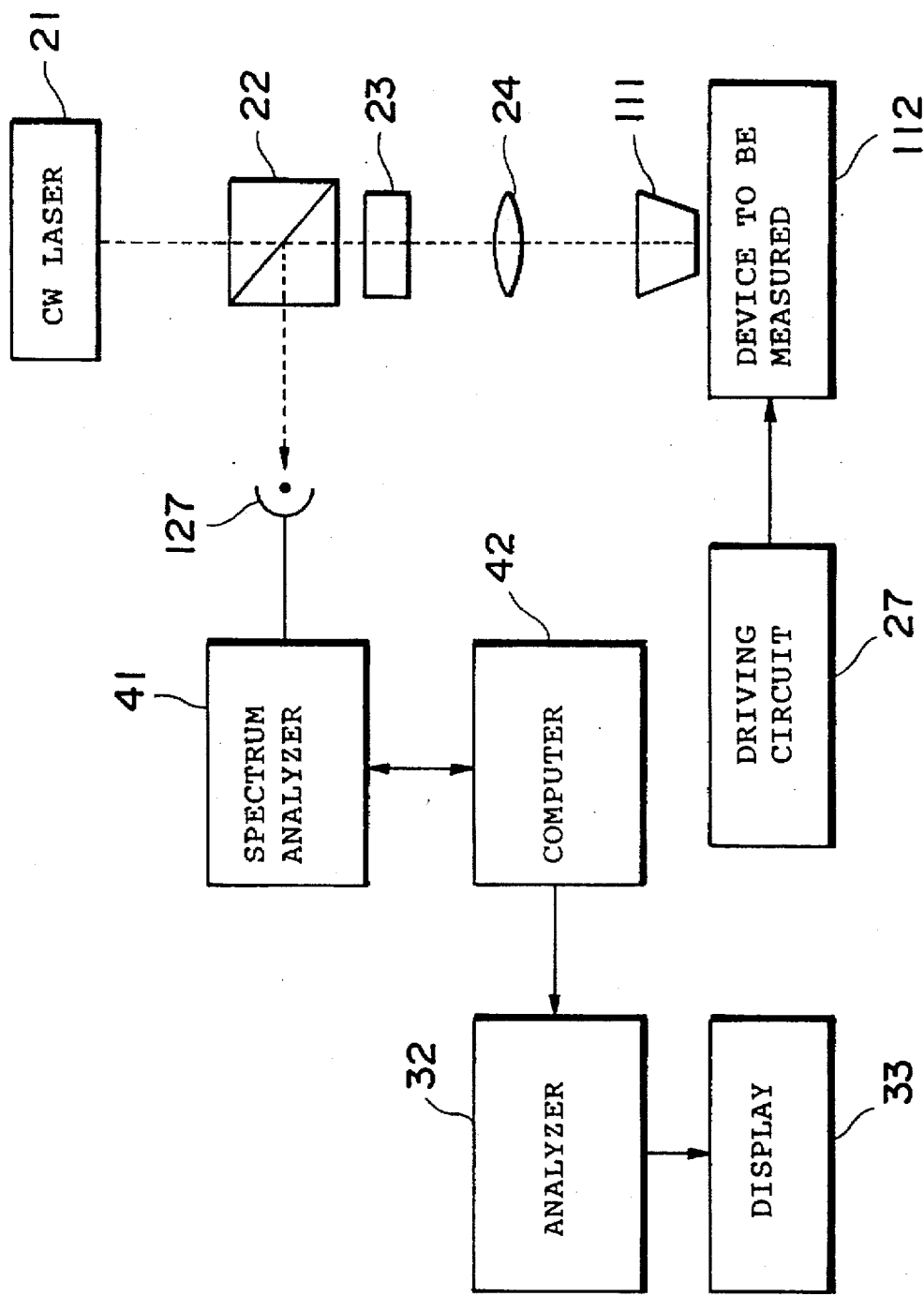
FIG. 2 is a block diagram showing an E-O probing system according to the second embodiment.

A voltage measurement apparatus according to the second embodiment of the present invention will be described below. FIG. 2 is a block diagram showing the arrangement of the voltage measurement apparatus according to the second embodiment. Note that the same reference numerals as in FIGS. 1A (1A1 and 1A2) and 1B denote the same parts in FIG. 2, and a detailed description thereof will be omitted.

The difference between the voltage measurement apparatus of the second embodiment and the voltage measurement apparatus of the first embodiment described above is that a spectrum analyzer or a network analyzer 41 is connected to the output of a high-speed photodetector 127 and a computer 42 is connected to this spectrum analyzer 41 in the second embodiment. This embodiment does not employ the narrow-band amplifier 29, the fundamental frequency extractor 30, and the frequency multiplier 31 that are used in the first embodiment. Instead, the spectrum analyzer 41 and the computer 42 constitute a fundamental frequency extracting means, a frequency multiplying means, and a narrow-band amplifying means. The fundamental frequency extracting means sweeps the spectrum analyzer 41 from a predetermined sweep start frequency and extracts the frequency of a peak output, which is detected for the first time, as a fundamental frequency. The frequency multiplying means generates a measurement frequency which is an integral multiple of the fundamental frequency. The narrow-band amplifying means performs narrow-band amplification for the output from the photodetector 127 at the measurement frequency. That is, the spectrum analyzer 41 operates in the same fashion as in the first embodiment under the control of the computer 42. This operation will be described below with reference to the graphs shown in FIGS. 3A to 3F. In each of these graphs, the vertical axis shows a logarithmic indication of the output from the photodetector 127, and the horizontal axis shows the frequency.

Figure 3A:
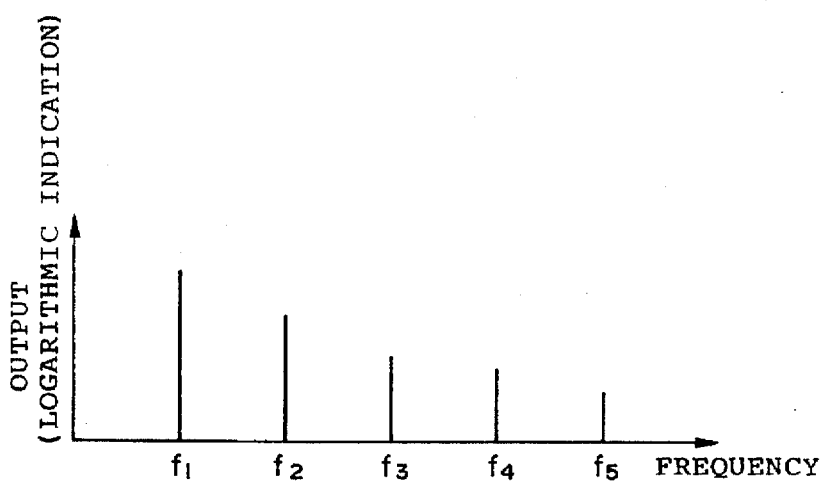
FIGS. 3A to 3F are graphs showing the measurements done by the system in FIG. 2.
Figure 3B:
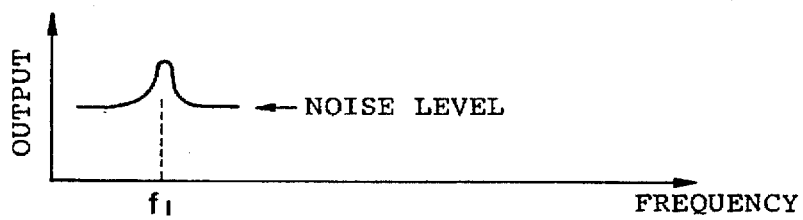
Figure 3C:
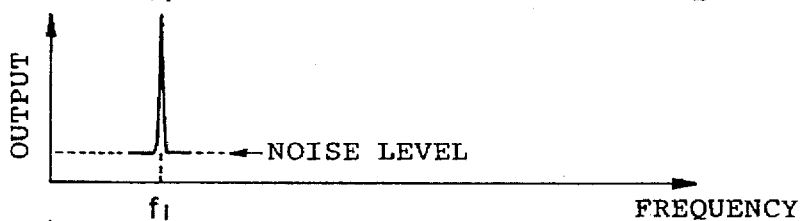
Figure 3D:
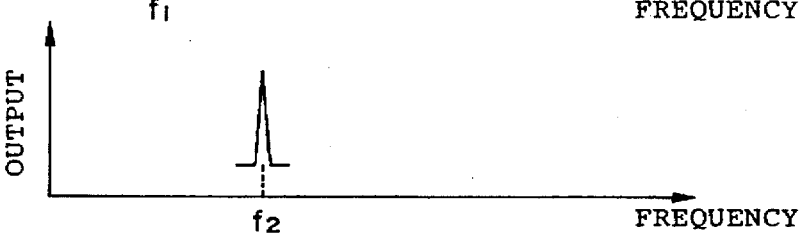
Figure 3E:
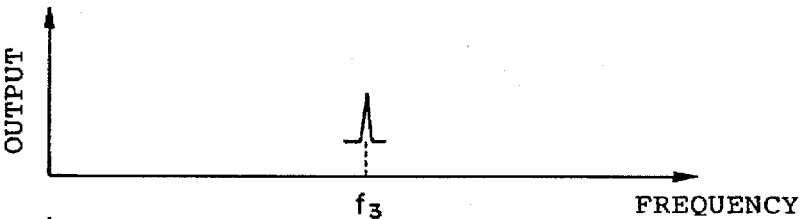
Figure 3F:
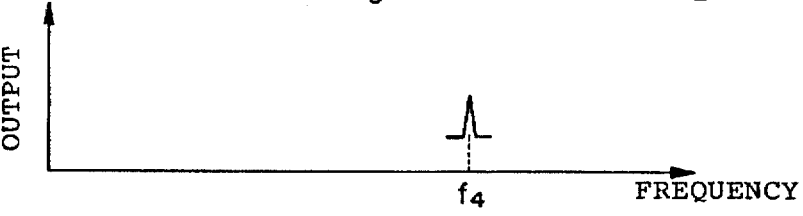

FIG. 3A exhibits ideal frequency characteristics of an electrical signal to be measured. That is, the fundamental frequency is $f_1$, and harmonic components $f_2, f_3, f_4, \ldots$ which are integral multiples of the fundamental frequency are present. When a measurement is started, the spectrum analyzer 41 sets a wide frequency band width B of, e.g., 100 MHz, in order to search for the fundamental frequency of an electrical signal to be measured, and starts sweeping from a start frequency of 10 MHz. When the peak output of the photodetector 127 is first detected from the start of sweep as in FIG. 3B, the frequency $f_1$ of this peak detection output is determined as a fundamental frequency. Once this peak output is detected, the frequency band width B of the spectrum analyzer 41 is narrowed to, e.g., 1 MHz, and, as illustrated in FIG. 3C, only portions around the detected peak output are again measured with a high accuracy. The result is that the fundamental frequency $f_1$ and its amplitude and phase are accurately obtained. When the fundamental frequency $f_1$ is thus attained, the computer 42 controls the spectrum analyzer 41 to discretely measure only the harmonic frequencies $f_2, f_3, f_4, \ldots$ which are integral multiples of the fundamental frequency $f_1$, as in FIGS. 3D, 3E, and 3F. During these measurements the frequency band width B of the spectrum analyzer 41 is kept narrowed to 1 MHz as in the above measurement. Consequently, these discrete measurements also are done with a high accuracy, so the amplitude and phase of second harmonic $f_2=2f_1$, third harmonic $f_3=3f_1$, fourth harmonic $f_4=4f_1, \ldots$ are accurately measured. An analyzer 32 receives these measurement results from the computer 42, accumulates the data, and measures the amplitude and the phase of the electrical signal to be measured. This phase is measured on the basis of the fundamental frequency $f_1$. The measured amplitude and phase of the electrical signal are displayed on the display 33.

In this second embodiment, as in the first embodiment described previously, the points of measurement are very few, so the measurements are completed within a short time period. Accordingly, the voltage measurement apparatus of the second embodiment achieves the same effects as in the first embodiment; that is, it is possible to measure an electrical signal to be measured on the frequency axis within short time periods with a high accuracy.

Figure 4:
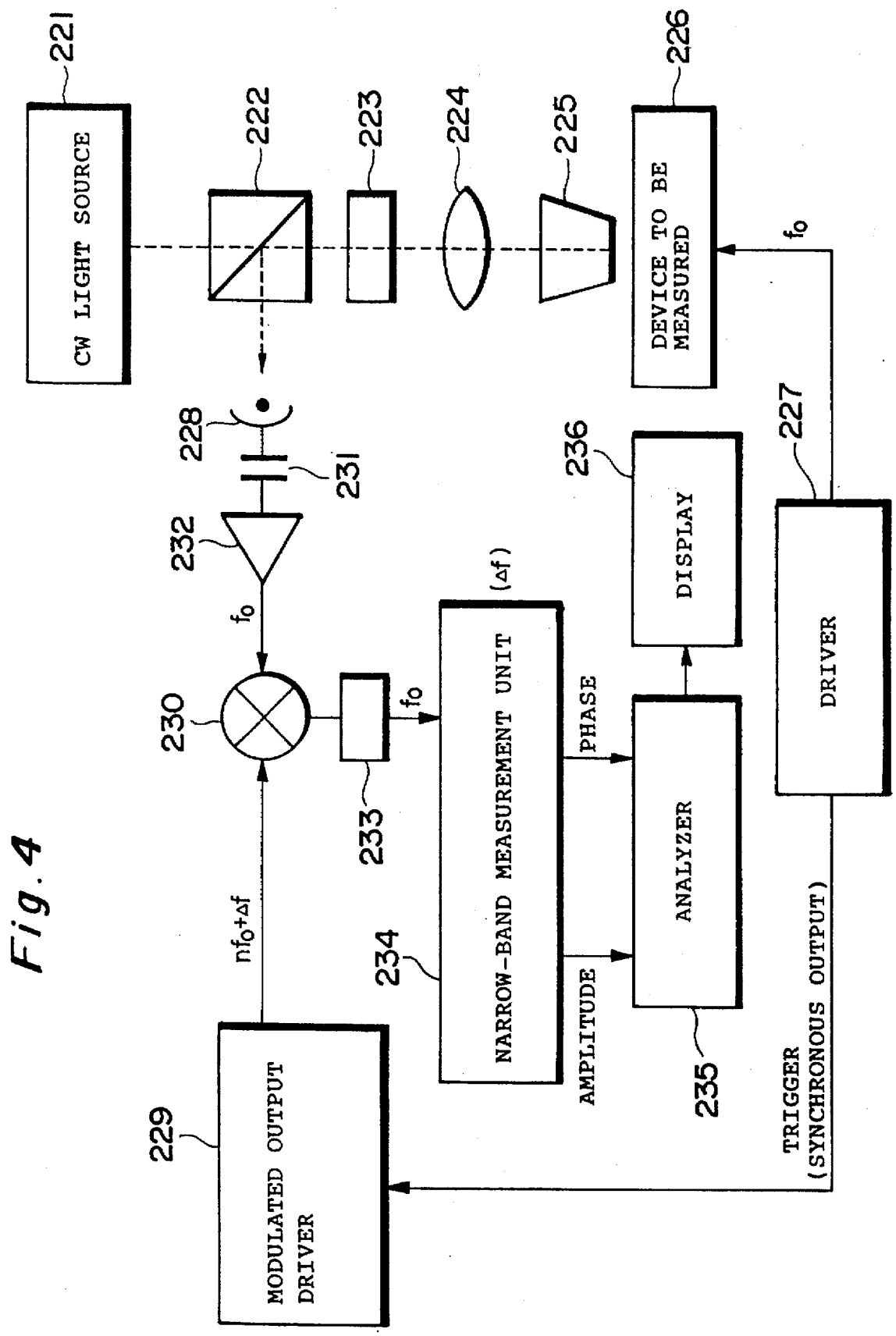
FIG. 4 is a block diagram showing the arrangement of a voltage measurement apparatus according to the third embodiment of the present invention.
Figure 5A:
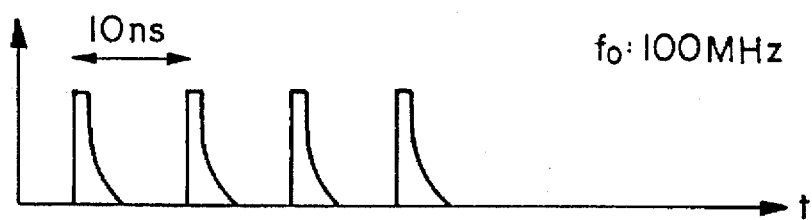
FIGS. 5A to 5F are graphs showing signals of individual parts of the voltage measurement apparatus according to the third embodiment.

FIG. 4 is a block diagram showing the arrangement of a voltage measurement apparatus according to the third embodiment of the present invention. FIGS. 5A to 5F are graphs showing the signal waveforms of individual parts of this apparatus. In the graph of FIG. 5A, the horizontal axis indicates time t and the vertical axis indicates the signal intensity. In the graphs of FIGS. 5B to 5F, the horizontal axis shows a frequency f and the vertical axis shows the signal intensity.

In this embodiment, a CW light source 221 is used as a light source, and continuous light is emitted as measurement light. This continuous light is converted into linearly polarized light by a polarizing beam splitter (PBS) 222, given an optical bias by a wave plate 223, and focused on an E-O probe 225 by a focusing lens 224.

The E-O probe 225 is applied with an electric field from a device 226 to be measured. That is, the device 226 receives a driving signal from a driver 227 and produces an electrical signal to be measured having the time waveform shown in FIG. 5A. A repetition frequency $f_0$ of this electrical signal is 100 MHz, and the electrical signal is produced every 10 ns.

Figure 5B:
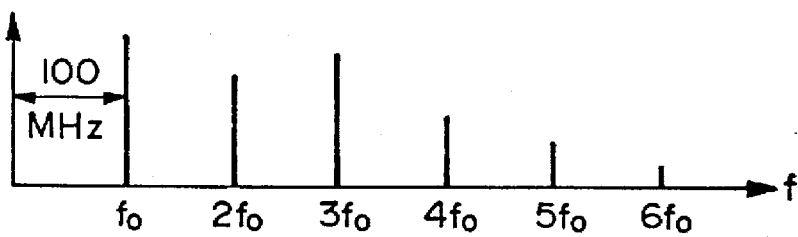

FIG. 5B illustrates the frequency characteristics of this electrical signal to be measured on the frequency axis. As in FIG. 5B, only components which are integral multiples of the repetition frequency $f_0$ (=100 MHz) are present. The electric field generated in the device 226 by the electrical signal is applied to the E-O probe 225.

The E-O probe 225 is made from an electro-optic material which changes its refractive index in accordance with the applied electric field. The electric field generated in the device 226 changes the polarized state of the measurement light which passes through the E-O probe 225. This change corresponds to the intensity of the applied electric field. The measurement light thus changed is reflected by a reflecting film (not shown) formed at the bottom tip of the E-O probe 225 and returns to the PBS 222 through the incident path. The PBS 222 converts the change of the polarized state into a change of the light intensity and outputs only polarized components perpendicular to the incident components to a high-speed photodetector 228.

The driver 227 outputs a trigger signal to a modulated output driver 229 in synchronism with the repetition frequency $f_0$. On the basis of this trigger signal, the modulated output driver 229 generates a modulated frequency signal. The frequency of this modulated frequency signal is the sum frequency, $nf_0 + \Delta f$, of an integral multiple $nf_0$ (n is an integer) of the repetition frequency $f_0$ of the electrical signal to be measured and a measurement beat frequency $\Delta f$. As this measurement beat frequency $\Delta f$, a frequency much lower than the repetition frequency $f_0$ is used.

The modulated frequency signal $nf_0 + \Delta f$ is applied to a frequency mixer 230. On the other hand, the signal detected by the high-speed photodetector 228 is input to a capacitor 231 where a DC component is removed from the signal to leave behind only an AC component. This AC component of the detected signal is amplified by a high-speed amplifier 232 and applied to the frequency mixer 230. Consequently, the frequency mixer 230 is applied with the modulated frequency signal $nf_0 + \Delta f$ from the modulated output driver 229 and the detected signal from the high-speed amplifier 232. As described above, this detected signal contains signal components that are integral multiples of the repetition frequency $f_0$ of the electrical signal to be measured.

Figure 5C:
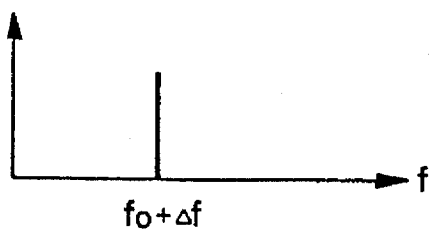
Figure 5D:
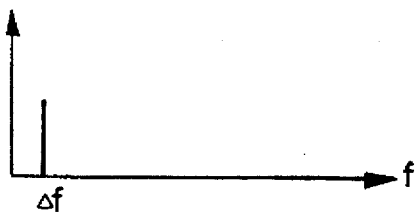

For example, if n=1 and the modulated output driver 229 outputs a modulated frequency signal $f_0 + \Delta f$, FIG. 5C, this modulated frequency signal $f_0 + \Delta f$ and the signal component with the frequency $f_0$ of the electrical signal are mixed. The frequency mixer 230 multiplies the two input signals and outputs signals having the sum and the difference frequencies of the two signal frequencies. A high-frequency cut filter 233 is provided at the output of the frequency mixer 230. Therefore, of the signals having the sum and the difference frequencies of the two signal frequencies, only a beat signal having the lower frequency, i.e., the difference frequency, $\Delta f$, FIG. 5D, is output.

Figure 5E:
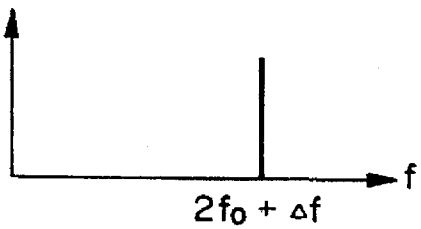
Figure 5F:
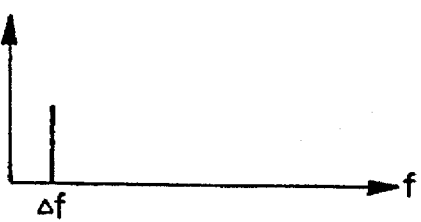

Also, if n=2 and the modulated output driver 229 outputs a modulated frequency signal $2f_0 + \Delta f$, FIG. 5E, the frequency mixer 230 mixes this modulated frequency signal $2f_0 + \Delta f$ and a second harmonic signal component with a frequency $2f_0$ of the electrical signal to be measured. The frequency mixer 230 outputs signals having the sum and the difference frequencies of these signal frequencies. The high-frequency cut filter 233 passes only a beat signal having the lower frequency, i.e., the difference frequency $\Delta f$, as illustrated in FIG. 5F.

In a similar fashion, a beat output with each nth harmonic signal component is extracted. These beat outputs are subjected to narrow-band detection done by a narrow-band measurement unit 234. That is, the narrow-band measurement unit 234 measures the amplitude and phase of the beat output with the fundamental repetition signal frequency $f_0$ and analogously measures the amplitude and phase of the beat output with the second harmonic signal component $2f_0$. Also, the narrow-band measurement unit 234 performs a narrow-band measurement for the beat output with the nth harmonic signal component $nf_0$.

The narrow-band measurement unit 234 with the above function is constituted by a network analyzer, a spectrum analyzer, or a lockin amplifier. Heterodyne measurement is to produce a beat output having the difference frequency of two signals and perform narrow-band detection for this beat output as described above. The measurement results thus obtained are output to an analyzer 235.

The analyzer 235 performs Fourier transformation for these measurement results and obtains a signal time waveform on the time axis. The obtained signal time waveform is displayed on a display 236. The voltage measurement apparatus of this third embodiment uses the CW light source 221 and the high-speed photodetector 228. The output from the high-speed photodetector 228 is input to the frequency mixer 230 and subjected to the heterodyne measurement.

The third embodiment with the above configuration achieves the following effects. That is, since the beat signal obtained by mixing is measured on the frequency axis, no high-speed oscilloscope is necessary as the measurement unit. Also, the CW light source 221, rather than a short-pulse light source, is used as the light source. This makes it unnecessary to generate short-pulse light having a distinct waveform free of tailing. According to this third embodiment, therefore, the voltage of the device 226 to be measured can be detected over a wide frequency band with a high sensitivity.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.223618/1994 filed on Sep. 19, 1994 and No.235162/1994 filed on Sep. 29, 1994 are hereby incorporated by reference.

What is claimed is:

1. A voltage measurement system comprising:

a probe comprising an electro-optic material to be arranged near a device to be measured;

a laser light source for emitting light into the probe;

a photodetector for detecting light reflected by the probe and providing a signal indicative thereof; and means, coupled to the photodetector, for analyzing a frequency of the photodetector output signal, wherein the analyzing means comprises:

fundamental frequency extracting means for detecting the fundamental frequency of the voltage signal, the voltage signal being output from a driver for applying a voltage signal having a fundamental frequency to the device to be measured;

frequency multiplying means for generating an integral multiple of the fundamental frequency based on the fundamental frequency detected by the fundamental frequency extracting means; and narrow-band amplifying means for amplifying the signal output from the photodetector on the basis of the output from the frequency multiplying means.

2. A system according to claim 1, wherein the analyzing means further comprises a processor for designating the frequency generated by the frequency multiplying means.

3. A voltage measurement system comprising:

a probe comprising an electro-optic material to be arranged near a device to be measured;

a laser light source for emitting light into the probe;

a photodetector for detecting light reflected by the probe and providing a signal indicative thereof; and means, coupled to the photodetector, for analyzing a frequency of the photodetector output signal, wherein the analyzing means comprises:

a frequency divider;

a processor for controlling the frequency divider;

a first phase comparator connected to the frequency divider and a driver for applying a voltage signal having a fundamental frequency to the device to be measured;

a first voltage controlled oscillator connected to the first phase comparator;

a local oscillator;

a first mixer;

a second phase comparator connected to the local oscillator and the first mixer;

a second voltage controlled oscillator connected to the second phase comparator, the first and second voltage controlled oscillators being connected to the first mixer;

a second mixer connected to the second voltage controlled oscillator and the photodetector; and a band-pass filter connected to the second mixer.

4. A voltage measurement system comprising:

a probe comprising an electro-optic material to be arranged near a device to be measured;

a laser light source for emitting light into the probe;

a photodetector for detecting light reflected by the probe and providing a signal indicative thereof; and means, coupled to the photodetector, for analyzing a frequency of the photodetector output signal, wherein the analyzing means comprises:

a ramp generator for generating a periodically changing voltage;

a voltage controlled oscillator for generating a voltage signal of a frequency corresponding to the periodically changing voltage input from the ramp generator;

a mixer for synthesizing input voltage signals from the voltage controlled oscillator and a driver for applying a voltage signal having a fundamental frequency to the device to be measured and output a synthetic voltage signal;

an intermediate frequency filter connected to the mixer to pass an intermediate frequency of the synthetic voltage signal;

a LOG amplifier connected to the intermediate frequency filter;

a first A/D converter connected to the LOG amplifier;

a second A/D converter connected to the ramp generator; and a peak detector connected to the first and second A/D converters to calculate the fundamental frequency from an output of the second A/D converter when an output signal from the first A/D converter peaks.

5. An electro-optic probing system for measuring frequency characteristics of an electrical potential of an object, the potential being generated by applying a voltage having an AC voltage with a fundamental frequency $f_0$ to the object from a driving circuit, said system comprising:

(A) an electro-optic probe having refractive index changeable in accordance with an electric field generated around the object by application of a voltage to the object;

(B) a light source for introducing light into said electro-optic probe;

(C) a photodetector for detecting light reflected by said electro-optic probe;

(D) fundamental frequency extracting means for extracting the AC voltage of the fundamental frequency $f_0$ from the output voltage of a driving circuit;

(E) frequency multiplying means, connected to said fundamental frequency extracting means, for generating a frequency $nf_0$, n being an integer; and (F) a narrow-band amplifier connected to said photodetector and said frequency multiplying means to amplify only an AC voltage signal having the frequency $nf_0$ output from said photodetector.

* * * * *